(12) United States Patent
Velazco

(10) Patent No.: US 11,616,574 B2
(45) Date of Patent: Mar. 28, 2023

(54) OPTICAL GROUND TERMINAL

(71) Applicant: California Institute of Technology, Pasadena, CA (US)

(72) Inventor: Jose E. Velazco, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 75 days.

(21) Appl. No.: 17/184,446

(22) Filed: Feb. 24, 2021

(65) Prior Publication Data

US 2021/0306071 A1    Sep. 30, 2021

Related U.S. Application Data

(60) Provisional application No. 63/000,061, filed on Mar. 26, 2020.

(51) Int. Cl.

| H04B 10/118 | (2013.01) |
|---|---|
| H04B 10/61 | (2013.01) |
| H04B 10/50 | (2013.01) |
| H04B 10/25 | (2013.01) |
| H01S 5/042 | (2006.01) |
| H01Q 3/26 | (2006.01) |
| G02B 27/30 | (2006.01) |
| G02B 26/08 | (2006.01) |
| G01S 3/48 | (2006.01) |

(52) U.S. Cl.
CPC ............ *H04B 10/118* (2013.01); *G01S 3/48* (2013.01); *G02B 26/0816* (2013.01); *G02B 27/30* (2013.01); *H01Q 3/2676* (2013.01); *H01S 5/042* (2013.01); *H04B 10/25* (2013.01); *H04B 10/50* (2013.01); *H04B 10/616* (2013.01)

(58) Field of Classification Search
None
See application file for complete search history.

(56) References Cited

U.S. PATENT DOCUMENTS

| RE32,521 | E | 10/1987 | Fergason |
|---|---|---|---|
| 4,824,245 | A * | 4/1989 | Gardner ................. G01S 3/783 356/141.5 |
| 4,975,926 | A | 12/1990 | Knapp |
| 5,539,393 | A | 7/1996 | Barfod |
| 5,724,168 | A | 3/1998 | Oschmann et al. |
| 5,757,528 | A | 5/1998 | Bradley et al. |
| 5,880,867 | A | 3/1999 | Ronald |
| 6,424,442 | B1 | 7/2002 | Gfeller et al. |
| 6,788,898 | B1 * | 9/2004 | Britz ................. H04B 10/1125 398/118 |
| 7,873,278 | B2 | 1/2011 | Baiden |
| 7,953,326 | B2 | 5/2011 | Farr et al. |
| 9,438,338 | B1 | 9/2016 | Chan et al. |
| 9,455,787 | B2 | 9/2016 | Byers et al. |
| 9,515,729 | B2 | 12/2016 | Murshid et al. |
| 10,581,525 | B2 | 3/2020 | Velazco |
| 10,707,966 | B2 | 7/2020 | Velazco |

(Continued)

OTHER PUBLICATIONS

Velazco, "Omnidirectional Optical Communicator", Mar. 2-9, 2019, 2019 IEEE Aerospace Conference, 6 pages (Year: 2019).*

(Continued)

*Primary Examiner* — David W Lambert
(74) *Attorney, Agent, or Firm* — Steinfl + Bruno, LLP

(57) ABSTRACT

Optical ground terminals (OGT) allowing high optical rate communications for line of sight and non-line of sight operating conditions are disclosed. The described devices include a multifaceted structure where optical telescopes, phase array antennas, and arrays of optical detectors are disposed. Methods to calculate angle-of-arrival based the contributions from optical detectors are also disclosed.

24 Claims, 16 Drawing Sheets

(56) References Cited

U.S. PATENT DOCUMENTS

| | | | |
|---|---|---|---|
| 2001/0043379 | A1 | 11/2001 | Bloom et al. |
| 2003/0117623 | A1 | 6/2003 | Tokhtuev et al. |
| 2006/0239689 | A1 | 10/2006 | Ashdown |
| 2007/0127926 | A1 | 6/2007 | Marioni |
| 2009/0009391 | A1* | 1/2009 | Fox .................. H01Q 1/288 |
| | | | 342/372 |
| 2010/0034540 | A1 | 2/2010 | Togashi |
| 2010/0054746 | A1 | 3/2010 | Logan |
| 2010/0254711 | A1* | 10/2010 | Miller ............... H04B 10/6932 |
| | | | 398/136 |
| 2010/0260503 | A1 | 10/2010 | Zhovnirovsky et al. |
| 2012/0206913 | A1 | 8/2012 | Jungwirth et al. |
| 2012/0275796 | A1 | 11/2012 | Yokoi |
| 2013/0223846 | A1 | 8/2013 | Joseph et al. |
| 2014/0003817 | A1 | 1/2014 | Roberts et al. |
| 2014/0248058 | A1 | 9/2014 | Simpson et al. |
| 2014/0270749 | A1 | 9/2014 | Miniscalco et al. |
| 2014/0294399 | A1 | 10/2014 | Makowski et al. |
| 2014/0376001 | A1 | 12/2014 | Swanson |
| 2015/0009485 | A1 | 1/2015 | Mheen et al. |
| 2015/0282282 | A1 | 10/2015 | Breuer et al. |
| 2015/0298827 | A1 | 10/2015 | Nguyen et al. |
| 2015/0372769 | A1 | 12/2015 | Farr et al. |
| 2016/0043800 | A1 | 2/2016 | Kingsbury et al. |
| 2016/0173199 | A1 | 6/2016 | Gupta et al. |
| 2016/0204866 | A1 | 7/2016 | Boroson et al. |
| 2016/0226584 | A1 | 8/2016 | Chalfant, III |
| 2017/0054503 | A1* | 2/2017 | Pescod ............... H04W 88/085 |
| 2018/0003837 | A1 | 1/2018 | Morris et al. |
| 2018/0102843 | A1* | 4/2018 | Wang ................ H04B 10/1123 |
| 2018/0122978 | A1 | 5/2018 | Khatibzadeh et al. |
| 2018/0191431 | A1* | 7/2018 | Moision ............... H04L 1/1874 |
| 2019/0122593 | A1 | 4/2019 | Guillama et al. |
| 2019/0229805 | A1 | 7/2019 | Velazco |
| 2019/0349087 | A1 | 11/2019 | Velazco |

OTHER PUBLICATIONS

Aguilar, A. C., et al., "Simultaneous Optical Links with the Inter-Satellite Omnidirectional Optical Communicator," in *IEEE Aerospace Conference Proceedings*, 2020.

Alexander, J., et al., "Scientific Instrumentation of the Radio-Astronomy-Explorer-2 Satellite," *Astron. & Astrophys.* vol. 40, No. 4, pp. 365-371, 1975.

de Kok, M., et al., "CubeSat Array for Detection of RF Emissions from Exo planet using Inter Satellites Optical Communicators," in *IEEE Aerospace Conference Proceedings*, 2020.

Velazco, J. E., et al., "Inter-satellite o mn idirectional o ptical co mmunicator for remote sensing," *SPIE Opt. Eng. + Appl.*, vol. 10769, 2018.

Velazco, J. E., et al., "Q4—a CubeSat Mission to Demonstrate Omnidirectional Optical Co mmunications," in *IEEE Aerospace Conference Proceedings*, 2020.

Velazco, J. E., "Omnidirectional Optical Communicator," in *IEEE Aerospace Conference Proceedings*, 2019, pp. 1-6.

Boyraz, O., et al., "Omnidirectional Inter-Satellite Optical Communicator (ISOC), ISOC Enables Gigabit Communication Between CubeSats", available at https://ntrs.nasa.gov/search.jsp?R=20180002972, Mar. 3, 2017. 2 pages.

Non-Final Office Action for U.S. Appl. No. 1616/394,695, filed Apr. 25, 2019 on behalf of California Institute of Technology. dated Jan. 15, 2020. 15 Pages.

Non-Final Office Action for U.S. Appl. No. 16/218,394, filed Dec. 12, 2018 on behalf of California Institute of Technology. dated Sep. 13, 2019. 24 pages.

Notice of Allowance for U.S. Appl. No. 1616/394,695, filed Apr. 25, 2019 on behalf of California Institute of Technology. dated Apr. 29, 2020. 6 Pages.

Notice of Allowance for U.S. Appl. No. 16/218,394, filed Dec. 12, 2018 on behalf of California Institute of Technology. dated Jan. 7, 2020. 11 Pages.

Velazco et al. "High data rate inter-satellite Omnidirectional Optical Communicator", 32nd Annual AIAA/USU Conference on Small Satellites, Aug. 4-9, 2018. 5 pages.

Velazco, J., et al., "An Interplanetary Network Enabled by SmallSats" IEEE AerospaceConference, Aug. 2020—ieeexplore.ieee.org. Available online from https://trs.jpl.nasa.gov/bitstream/handle/2014/51134/CL%2320-0063.pdf?sequence=1. 10 Pages.

\* cited by examiner

OPTICAL GROUND TERMINAL

CROSS REFERENCE TO RELATED APPLICATIONS

The present application claims priority to U.S. Provisional Patent Application No. 63/000,061 filed on Mar. 26, 2020, which is incorporated herein by reference in its entirety.

STATEMENT OF GOVERNMENT GRANT

This invention was made with government support under Grant No. 80NMO0018D0004 awarded by NASA (JPL). The government has certain rights in the invention.

FIELD

The present disclosure is related to optical terminals, and more particularly to optical ground terminals (OGT) allowing high optical rate communications for line of sight and non-line of sight operating conditions.

BACKGROUND

Communications with spacecraft in deep space is achieved mainly via NASA's Deep Space Network (DSN). In the near future, multiple small spacecraft missions are expected to be launched in low-earth orbit, geosynchronous, and lunar orbit. Due to the large amount of imminent missions, some of which will include fast orbiting spacecraft, it is estimated that the Deep Space Network and existing ground terminals will not be able to cope with communications demands. Therefore, there is a need for new and affordable communications stations (with smaller antennas) that can cope with the fore coming demand and with fast orbiting spacecraft. Furthermore, with the advent of optical communications systems, it would be also advantageous that these new stations be capable of handling optical signals as well as radiofrequency (RF) signals.

In the case of global telecommunications, more and more cities are getting interconnected as they pursue the goal of crowning themselves as smart cities. A smart city is an urban area that uses different types of electronic data collection sensors to supply information which is used to manage assets and resources efficiently. The demand for fast communications is further exacerbated by the advent of the Internet of Things (IoT). The IoT is the network of devices such as vehicles, and home appliances that contain electronics, software, sensors, actuators, and connectivity which allows these things to connect, interact and exchange data.

The last mile is typically the speed bottleneck in communication networks; its bandwidth effectively limits the bandwidth of data that can be delivered to the customer. This is because retail telecommunication networks have the topology of "trees", with relatively few high capacity "trunk" communication channels branching out to feed many final mile "leaves". The final mile links, being the most numerous and thus most expensive part of the system, as well as having to interface with a wide variety of user equipment, are the most difficult to upgrade to new technology. The last mile connectivity is limited by the fact that old buildings (both residential and commercial) lack direct access to coax or fiber optic wired facilities (most of old buildings are not properly wired for modern internet connectivity). Last mile connectivity is typically addressed by using wireless radiofrequency solutions which are inherently slow. Faster connections are therefore needed to address the last mile connectivity issues.

A limitation in achieving full city connectivity in downtown areas is due to the lack of access to wired or fiber internet services. For example, telephone trunk lines that carry phone calls between switching centers are made of modern optical fiber, but the last mile is typically twisted pair wires, a technology which has essentially remained unchanged for over a century since the original laying of copper phone cables. The last mile connectivity typically faces the following challenges: a) obstructions, b) spectrum scarcity, c) interference, d) motion and e) complex installation.

SUMMARY

The disclosed methods and devices address the described challenges and provide practical solutions to the above-mentioned issues and needs.

According to a first aspect of the disclosure, an optical ground terminal (OGT) is provided, comprising: a multifaceted structure with a geometry to allow a full sky coverage, the multifaceted structure having at least one facet comprising a steerable optical telescope, and an array of optical detectors; and a mixed signal board including a field-programmable gate array (FPGA) to control the optical telescope and the array of optical detectors, the FPGA being configured to calculate an angle-of-arrival based on a contribution of sensed values of each optical detector of the array of optical detector via an amplitude and/or phase comparison.

According to a second aspect of the disclosure, a method of data communication at gigabit rate is disclosed, the method comprising: providing a multifaceted structure with a geometry to allow a full sky coverage; placing a steerable optical telescope and an array of optical detectors on each facet of the multifaceted structure; receiving an incoming signal through the array of optical detectors; calculating an angle-of-arrival based on sensed values from contributing optical detectors of the arrays of optical detectors; selecting an optical telescope based on the calculated angle-of-arrival; and steering the optical telescope to transmit in a direction of a designated target.

According to a third aspect of the disclosure, a method of data communication at gigabit rate is disclosed, the method comprising: providing a multifaceted structure with a geometry to allow a full sky coverage; placing a steerable optical telescope, a phase array antenna, and an array of optical detectors on each facet of the multifaceted structure; A) in a first mode: receiving an optical signal by the array of optical detectors; transforming the optical signal to an electrical signal; amplifying the electrical signal to generate an amplified signal; and transmitting the amplified signal through the phased array antenna in a direction of a designated target, B) in a second mode: receiving a radio frequency (RF) signal via the phase array antenna; demodulating the RF signal to generate a baseband signal; passing the baseband signal to the optical telescope; and optically transmitting in a direction of a designated target.

Further aspects of the disclosure are provided in the description, drawings and claims of the present application.

DETAILED DESCRIPTION

The disclosed OGT is an optical terminal that allows free-space high data rate optical communications with other OGTs and with airborne and spaceborne optical communicators. Such optical terminal will also allow fast communications for line of sight and non-line of sight operating conditions and could be an enabling technology for last mile, IoT and smart cities.

Figure 1:
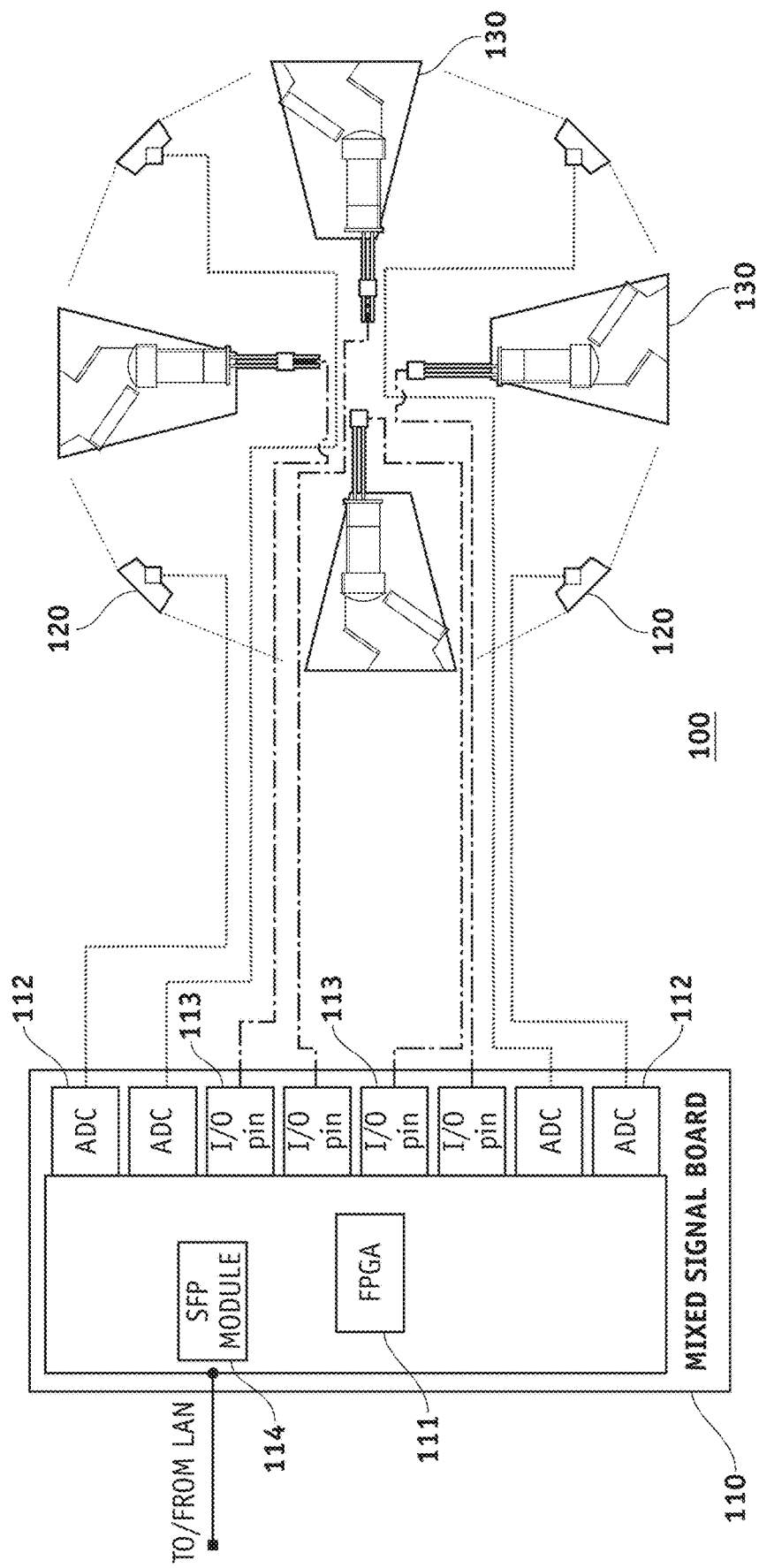
FIG. 1 shows the diagram of an exemplary optical ground terminal according to an embodiment of the present disclosure.

FIG. 1 shows a diagram of an exemplary OGT (100) according to an embodiment of the present disclosure. The OGT (100) comprises an array of fast receiving optical detectors (120), transmit optical telescopes (130), and a mixed signal board (110) including a fast processor, for example a (field-programmable gate array) FPGA (111), a plurality of input/output (I/O) ports (113) and a plurality of (analog to digital converters) ADC (112). The optical detectors and telescopes (120, 130) may be controlled by FPGA (111). The OGT (100) may be connected to a local local-area-network (LAN, from the facility that houses the OGT) via a fast wired connection such as RF, CAT6, or small form-factor pluggable (SFP) module (114). The transmit optical telescopes (130) and optical detectors (120) are connected to FPGA (111) via I/O ports (113) and ADCs (112) respectively.

With continued reference to FIG. 1, the transmit optical telescopes (130) and optical detectors (120) may be arranged, for example around a spherical holding structure for full sky coverage. In accordance with the teachings of the present disclosure, OGT (100) of FIG. 1 features a multi-faceted geometry (e.g. dodecahedron, half-dodecahedron, truncated dodecahedron or icosahedron) where each facet may hold an optical detector and a transmit telescope. The optical detector may be implemented as a single detector or an array of detectors.

Figure 2A:
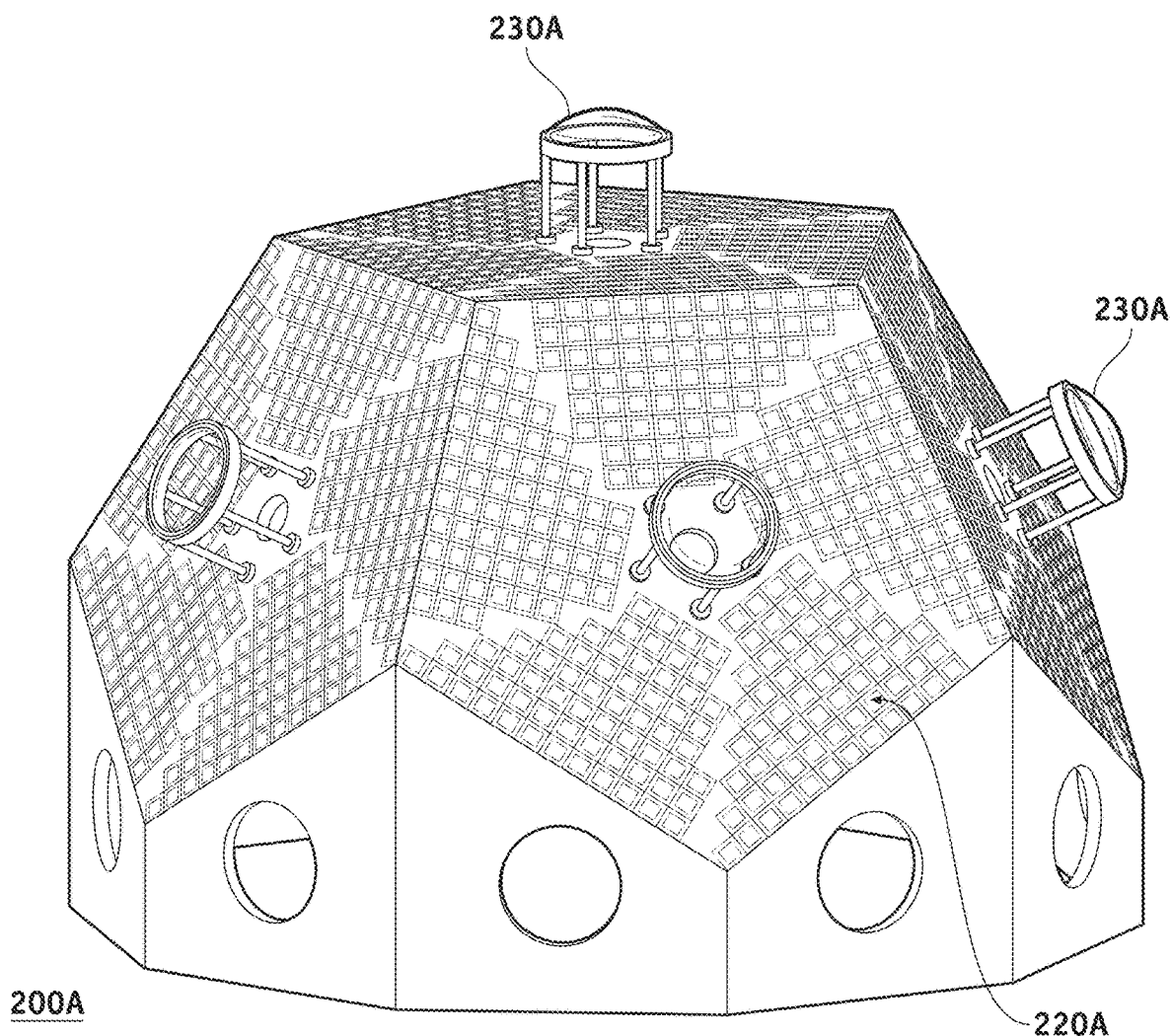
FIGS. 2A-2D shows exemplary geometries of optical ground terminals according to various embodiments of the present disclosure.

FIG. 2A shows an exemplary implementation of an OGT (200A) with a half-dodecahedron body with 6 facets. In such embodiment, 6 detector arrays (220A) and 6 transmit telescopes (230A) may be implemented.

Figure 2B:
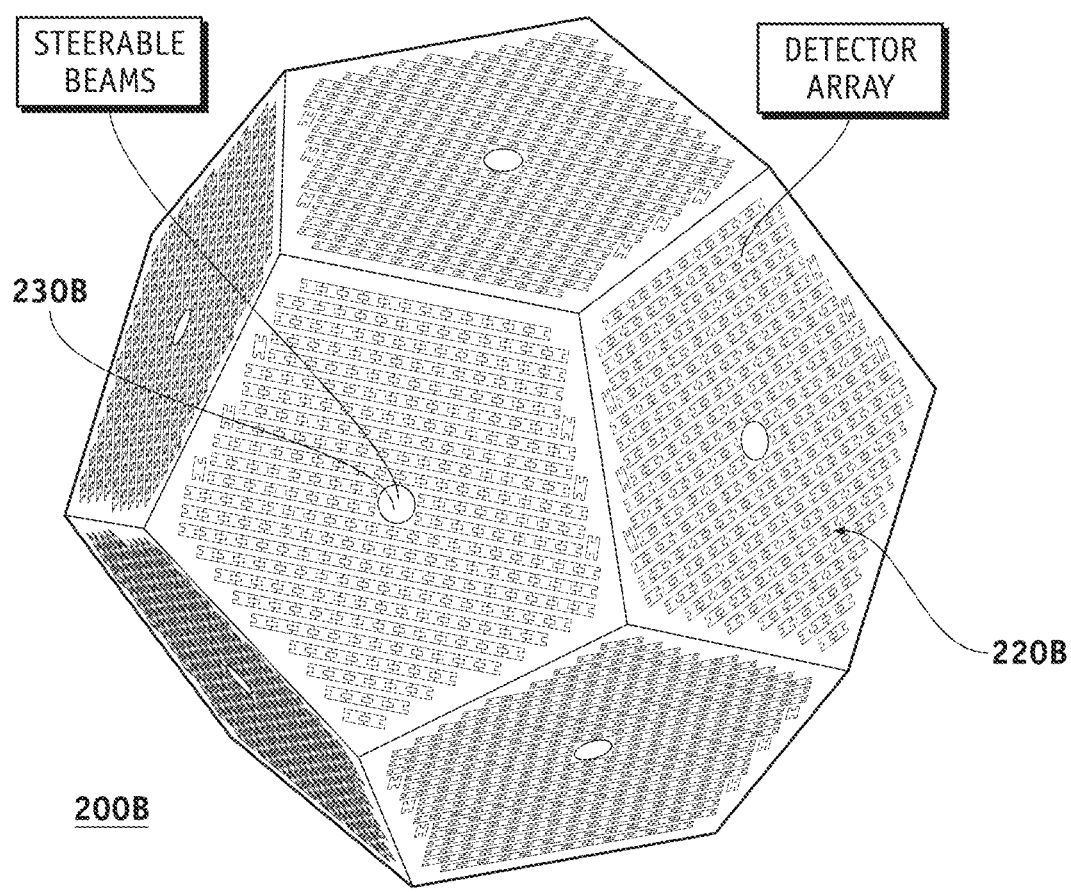

FIG. 2B shows another exemplary implementation of an OGT (200B) with complete dodecahedron body. In this case, the OGT has 12 facets, where at least 11 facets can be used (one facet would be facing the ground). As shown, the facets are covered with arrays of detectors (220B) and 11 steerable optical telescopes (230B).

Figure 2C:
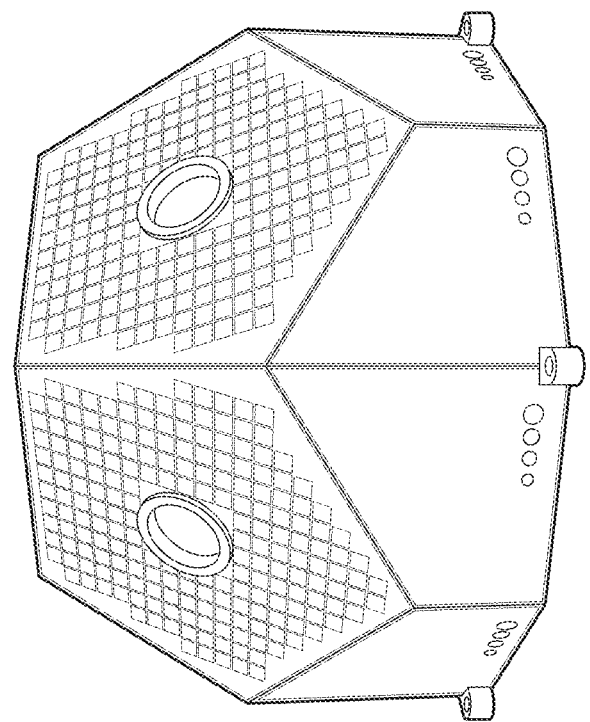
Figure 2C:
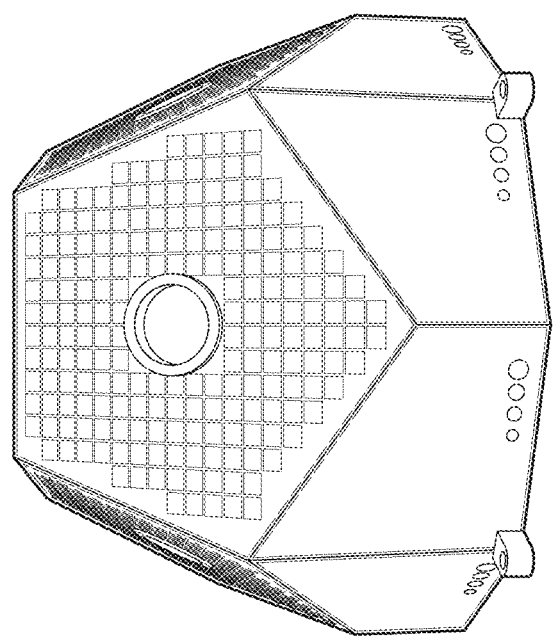

FIG. 2C shows a prototype of an OGT with a half-dodecahedron body built by the inventor. Two different views of the same prototype are shown in FIG. 2C.

Figure 2D:
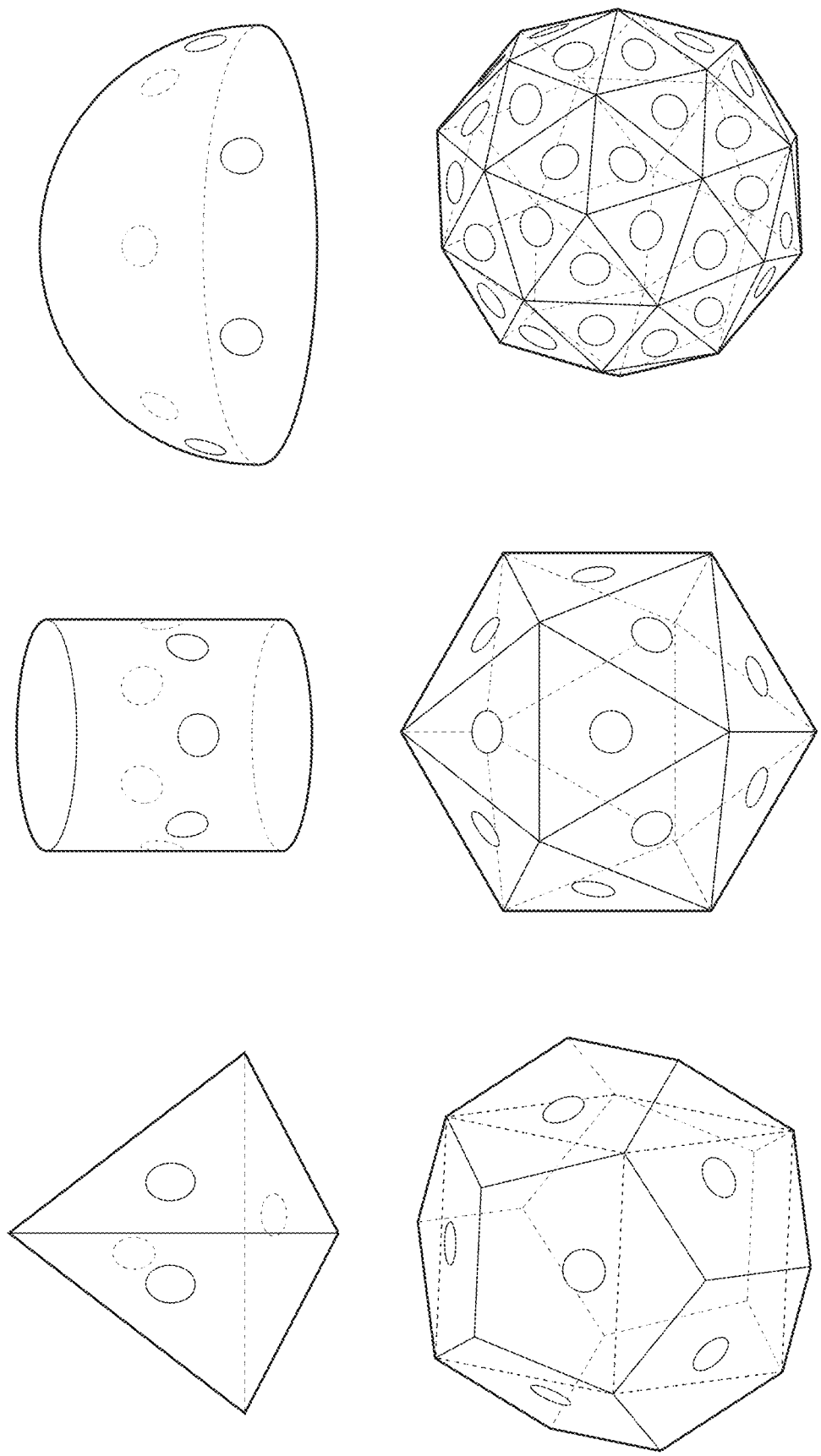

According to various embodiments of the present disclosure, OGT (100) of FIG. 1 can have a shape of one of a Platonic, Archimedean, or Johnson solid or a combination thereof. FIG. 2D illustrates exemplary OGT geometries where dots are representatives of optical detectors. Different geometries other than the one show in FIG. 2D may also be envisaged.

Figure 3A:
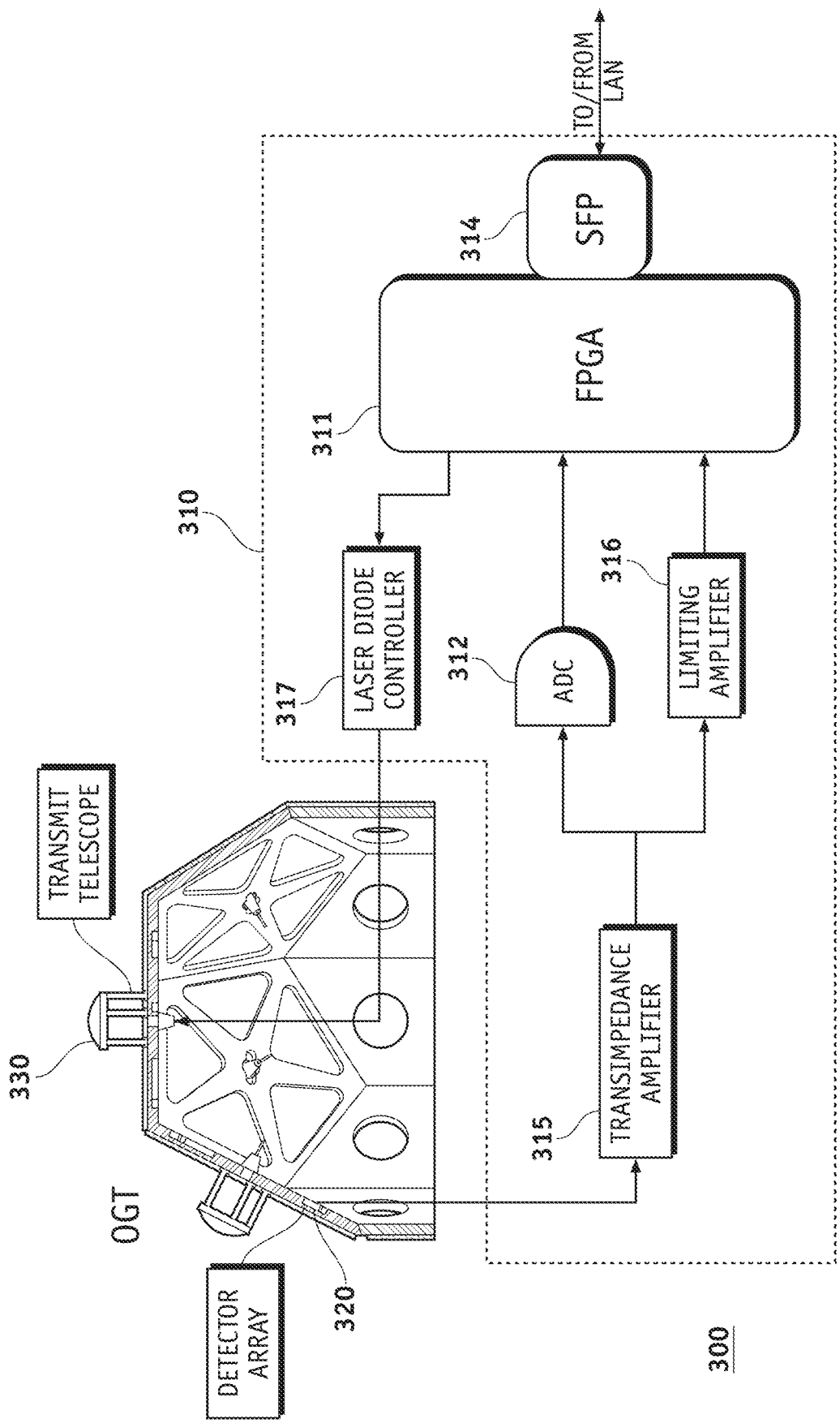
FIG. 3A shows a diagram of an exemplary optical ground terminal according to an embodiment of the present disclosure.

FIG. 3A shows an exemplary OGT (300) according to an embodiment of the present disclosure. The OGT (300) comprises an array of fast receiving optical detectors (320), transmit optical telescopes (330), and a mixed signal board (310) including FPGA (311), laser diode controller (317), (transimpedance amplifier) TIA (315), ADC (312), limiting amplifier (316) and SFP (314). As shown, the output of each detector (320) is amplified by TIA (315) and the amplified signal is then fed to ADC (312) and limiting amplifier (316). The output of the limiting amplifier (316) provides the communications signal at a voltage level suitable for FPGA (311) processing. The embodiment shown makes use of an FPGA with SFP capability. SFP (314) will allow fast interconnection to the site's LAN at data rates of up to tens of gigabits per second.

With continued reference to FIG. 3A, the ADC (312) output is used to measure the amplitude of the incoming signal (sensed by the corresponding facet) to allow angle-of-arrival (AOA) calculation. The angle-of-arrival output from each facet is then digitized by its corresponding ADC (312) and used by FPGA (311) for AOA calculation of the incoming signal. In accordance with the teachings of the present disclosure, the AOA algorithm is based on the contribution of sensed values of each detector via amplitude-and/or phase-comparison.

Figure 3B:
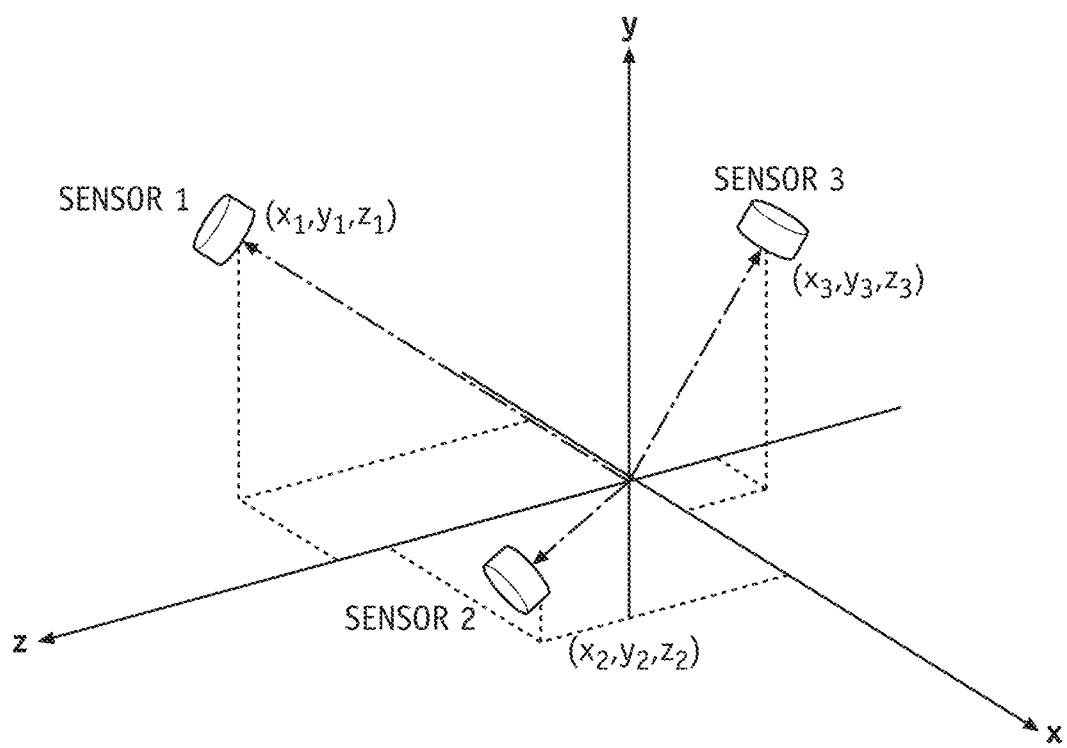
FIG. 3B is an exemplary illustration of optical detectors in a Cartesian reference system according to an embodiment of the present disclosure.

One embodiment of the AOA calculation technique is based on the comparison of the sensed amplitude from each detector. The angle of arrival is normally determined with respect to the center of the reference system (e.g. Cartesian, cylindrical or spherical). FIG. 3B illustrates an exemplary case where the optical sensors are placed in a Cartesian reference system.

With reference to FIG. 3B, the AOA algorithm may calculate the contribution of each detector in the x, y and z directions. In the general case of n detectors whose total detector contributions in the x, y, z are $S_x$, $S_y$ and $S_z$, the following can be written:

$$S_x = \sum_i^n a_{x_i}$$

$$S_y = \sum_i^n a_{y_i}$$

$$S_z = \sum_i^n a_{z_i}$$

where $a_{x_i}$, $a_{y_i}$ and $a_{z_i}$ are the x, y and z sensed values of the $i^{th}$ detector. The signal bearing can be calculated as, $$\theta_s = \operatorname{atan}\left(\frac{S_z}{S_x}\right)$$

Assuming the resultant in the x,z plane as $S_{x,z}$ we obtain, $$S_{xz} = \sqrt{(S_x^2 + S_z^2)}$$

The elevation angle can then be calculated as $$\delta_e = \operatorname{atan}\left(\frac{S_y}{S_{xz}}\right)$$

Consequently, the bearing and elevation of the incoming signal are given by $\theta_s$ and $\delta_e$, respectively.

The sensed values $a_{x_i}$, $a_{y_i}$ and $a_{z_i}$ may be dependent on the orientation and sensor type. The values provided by the selected detector will have an angular dependence (e.g., linear, cosine, etc.). Also, the calculation of bearing and elevation angles could be performed using various mathematical methods (e.g., matrices, arrays, etc.) but all should give the same result.

Figure 3C:
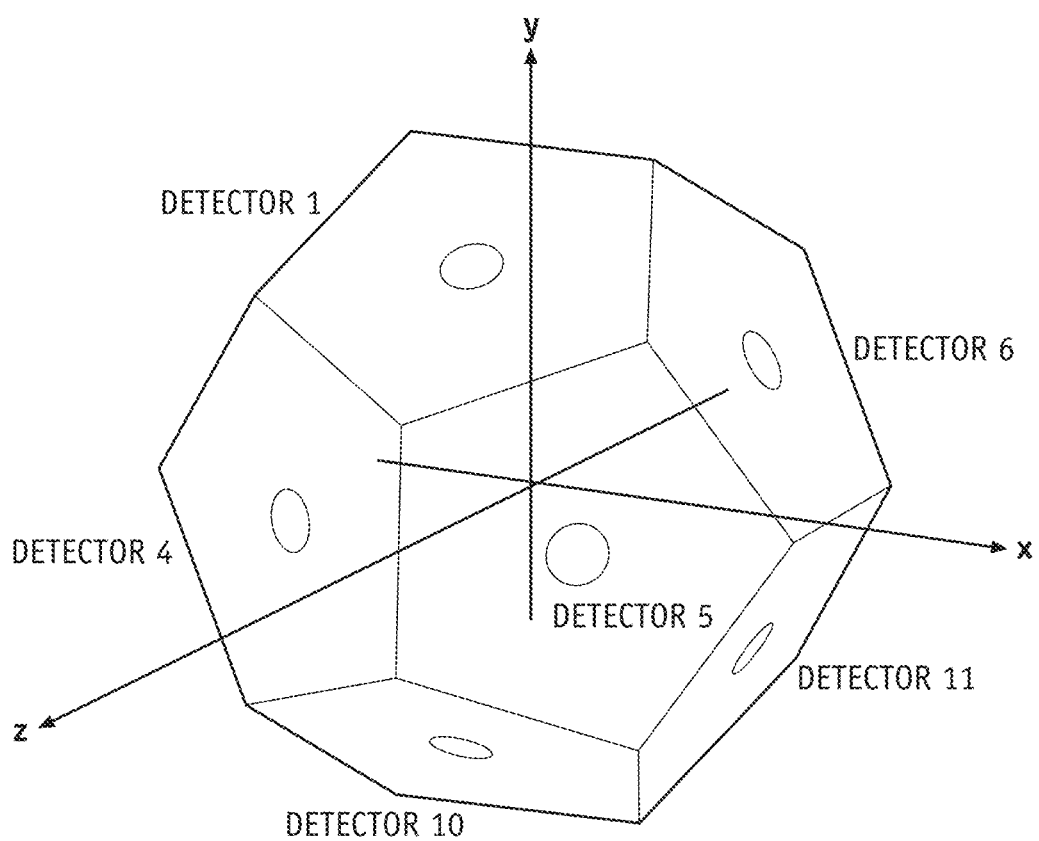
FIG. 3C is an exemplary illustration of an optical ground terminal with the shape of dodecahedron and placed in a Cartesian reference system according to an embodiment of the present disclosure.

FIG. 3C illustrates an exemplary case where the OGT has the shape of a dodecahedron and placed in the Cartesian reference system. In this case, the total sensor contributions in the x, y, z are $S_x$, $S_y$ and $S_z$, given by $$S_x = \sum_i^{12} a_{x_i} = a_{x_1} + a_{x_2} + a_{x_3} \ldots + a_{x_{12}}$$

$$S_y = \sum_i^{12} a_{y_i} = a_{y_1} + a_{y_2} + a_{y_3} \ldots + a_{y_{12}}$$

$$S_z = \sum_i^{12} a_{z_i} = a_{z_1} + a_{z_2} + a_{z_3} \ldots + a_{z_{12}}$$

where $a_{x_i}$, $a_{y_i}$ and $a_{z_i}$ are the x, y and z sensed values of the $i^{th}$ detector (i=1, 2, . . . 12). The signal bearing can be calculated as, $$\theta_s = \operatorname{atan}\left(\frac{S_z}{S_x}\right)$$

Assuming the resultant in the x,z plane as $S_{x,z}$ we obtain, $$S_{xz} = \sqrt{(S_x^2 + S_z^2)}$$

The elevation angle can then be calculated as $$\delta_e = \operatorname{atan}\left(\frac{S_y}{S_{xz}}\right)$$

Consequently, the bearing and elevation of the incoming signal are given by $\theta_s$ and $\delta_e$, respectively.

Figure 4:
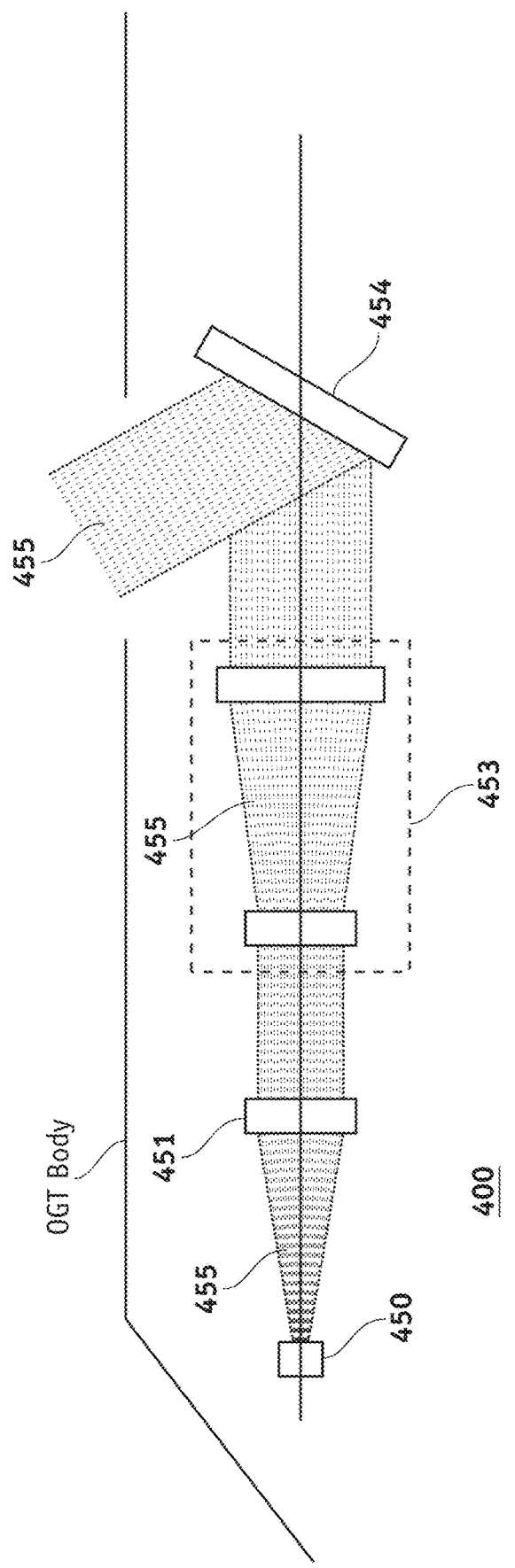
FIG. 4 shows an exemplary implementation of an optical telescope according to an embodiment of the present disclosure.

FIG. 4 shows an exemplary implementation of optical telescope (330) of FIG. 3A for an OGT (400). As shown in FIG. 4, optical telescope (330) of FIG. 3A comprises a fast, adjustable wavelength (able to be modulated) laser diode (450), collimator (451), an optional beam expander (453) and a fast scanning mirror (454). Adjustable beam expander (453) may be used to control the initial beam diameter (as it comes out of the OGT) and thus to adjust the on-target optical beam size. Bean expander (453) further allows the OGT to perform adaptive operation to respond to changing weather and other conditions. With reference to FIGS. 3-4, laser diode (450) is controlled via laser diode controller (317) receiving commands from FPGA (311).

With continued reference to FIG. 4, laser diode beam (455) is collimated via collimator (451) and injected into beam expander (453) which may be externally controlled (external controller not shown). Beam expander (453) can expand the diameter of the output beam (455) in response to the commands of the external controller. After being expanded, the optical beam (455) impinges on steering mirror (454) where it is directed in direction of the target.

Figure 5:
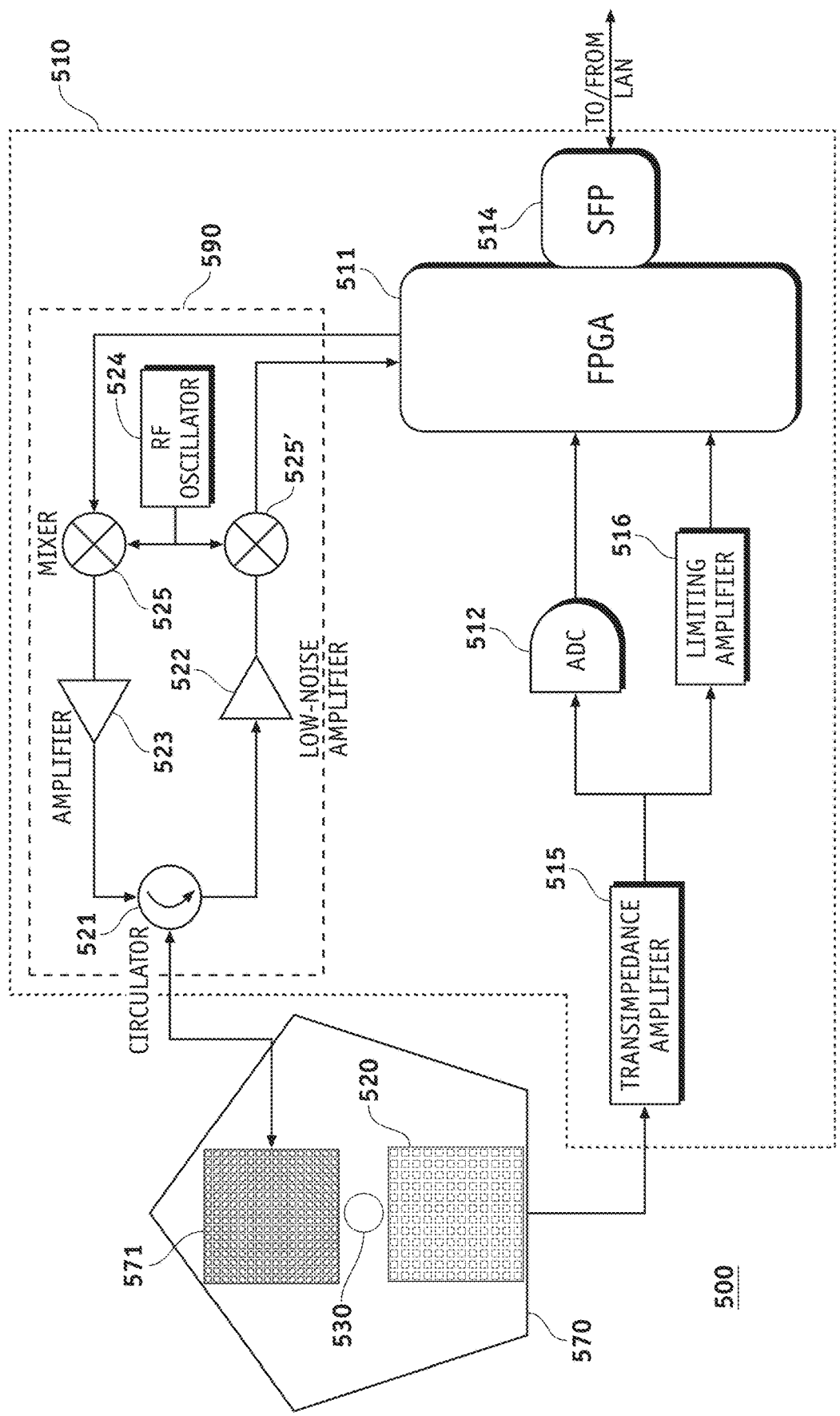
FIG. 5 shows the diagram of an exemplary optical ground terminal according to an embodiment of the present disclosure.

FIG. 5 shows an exemplary OGT (500) according to an embodiment of the present disclosure. For the sake of clarity, only one OGT facet (570) of several facets is shown. Each facet (570) comprises an optical transmit telescope (530), array of optical detectors (520), and radio frequency (RF) phase array antenna (571). In other words, the embodiment of FIG. 5 includes the addition of phase array antennas in each facet, operating at radiofrequencies. Similar to OGT (300) of FIG. 3A, OGT (500) comprises TIA (515), ADC (512), limiting amplifier (516) and SFP (514) having similar functionalities as their respective counterparts of OGT (300) of FIG. 3A.

OGT (500) of FIG. 5 further comprises a transmit-receive (TR) module (590). According to an embodiment of the present disclosure, TR module (590) comprises, on a transmit side, RF oscillator (524), mixer (525), and amplifier (523). On the receive side, TR module (590) includes low-noise amplifier (522) and mixer (525'). Also shown is circulator (521) as a constituent of TR module (590). In a transmit mode, a signal coming from FPGA (511) is modulated using RF oscillator (524) and mixer (525). The modulated signal is then amplified using amplifier (523) and sent to the phase array antenna (571) via circulator (521). In a receive mode, the signal received by phase array antenna (571) is shifted to the baseband before being received by FPGA (511). According to an embodiment of the present disclosure, phase array antenna (571) may be an electronically steerable phase array antenna.

With further reference to FIG. 5, TR module (590) is coupled to both FPGA (511) and phase array antenna (571). The embodiment shown is able to receive and transmit RF and optical signals and to perform the translation from RF-to-Optical or Optical-to-RF. For example, OGT (500) could receive an RF signal from a cellphone via its phase array antenna (571). After going through TR module (590), the RF signal is received by FPGA (511) where it is demodulated, conditioned and sent to the optical telescope (530) for optical transmission to a satellite. Conversely, an optical signal could be received from a satellite by the detector array (520), amplified and fed into the FPGA (511) by limiting amplifier (516). This signal can then be fed to the TR module (571) by FPGA (511) and sent to a cellphone user via the RF phase array antenna (571). In an exemplary use case, an RF signal can be received by the phase arrays on the facets. Based on sensed values from contributing phased array antennas, an angle of arrival can be calculated similarly to what was described with regards to embodiments of FIGS. 3A-3C. A phased array antenna is then selected based on the calculated angle of arrival. This is followed by steering the selected phase array to transmit in a direction of the designated target.

With continued reference to FIG. 5, optical detector (520) may be implemented using photodetectors, avalanche photodetectors and/or silicon photomultipliers. The detector selection criteria may be based on active area, frequency response and operating voltages, among others. With reference to FIG. 5 and for optical beam steering, various technologies may be leveraged for implementation purpose. Examples of such technologies include but are not limited to micro electro-mechanical systems (MEMS), voice-coil, optical phase arrays, or galvanometer technologies.

Potential commercial applications of the disclosed OGTs include satellite communications, IOT, NLOS last mile and smart cities. The described devices could also be employed as an outdoor optical gateway for fast communications with other assets such as drones for emergency responders or the military.

Figure 6:
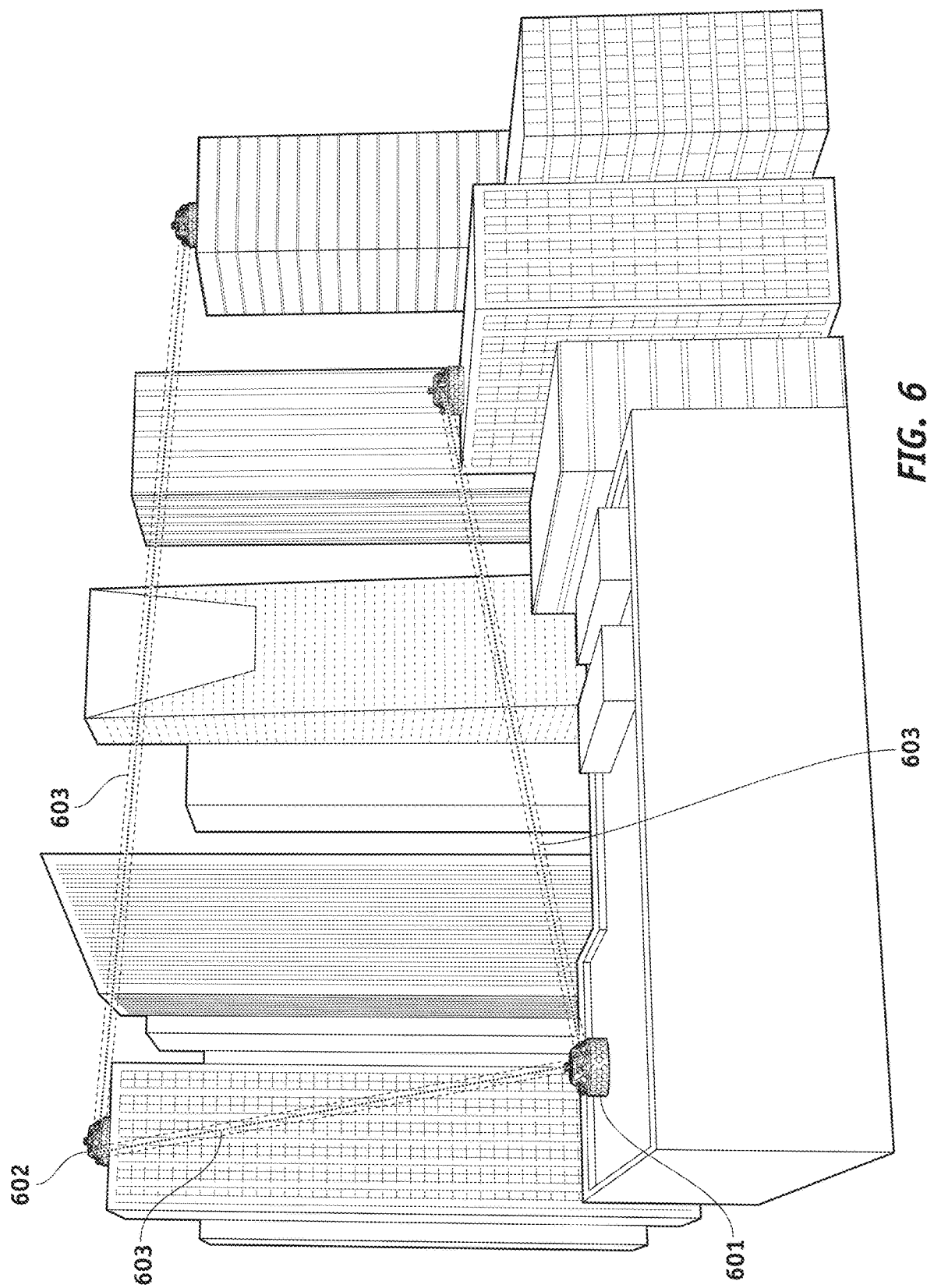
FIGS. 6-11 show exemplary applications of optical ground terminals according to various embodiment of the present disclosure.

The disclosed OGTs may be deployed at high ground elevations such as hilltops, posts or roof tops. FIG. 6 shows an exemplary system (600) including various OGTs deployed on rooftops of tall buildings and communicating with one another. As an example of operative conditions, when an incoming signal arrives to a first OGT (601) from a second OGT (602), OGT (601) calculates angle-of-arrival and processes the incoming information. OGT (601) also points the corresponding transmit telescope (not shown) in the angle-of-arrival direction of OGT (602) and establishes full duplex communications. The information received by OGT (601) may be immediately shared with the local LAN. In accordance with embodiments of the present disclosure, the OGTs are able to hold multiple optical links (603) simultaneously as shown in FIG. 6.

With continued reference to FIG. 6 and as a further example, an incoming signal from the local LAN is received by the OGT (601) via an SFP module (or RJ45 Ethernet module) at gigabit per second data rates. Depending on the designated target (either another OGT, a drone or a satellite), the OGT (601) selects the appropriate laser telescope and establishes a link with the target. Once the link is established, the OGT transmits the corresponding communications information to the target.

Associated with a system of OGTs such as the embodiment shown in FIG. 6, an optical management network (OMN) in according with the teachings of the present disclosure may be envisaged. Such OMN may have continuous and updated knowledge of all the OGTs, and optical communicators connected to its optical network. The OMN may also have a complete database with all the OGTs and optical communicators capable of participating in the OMN.

Figure 7:
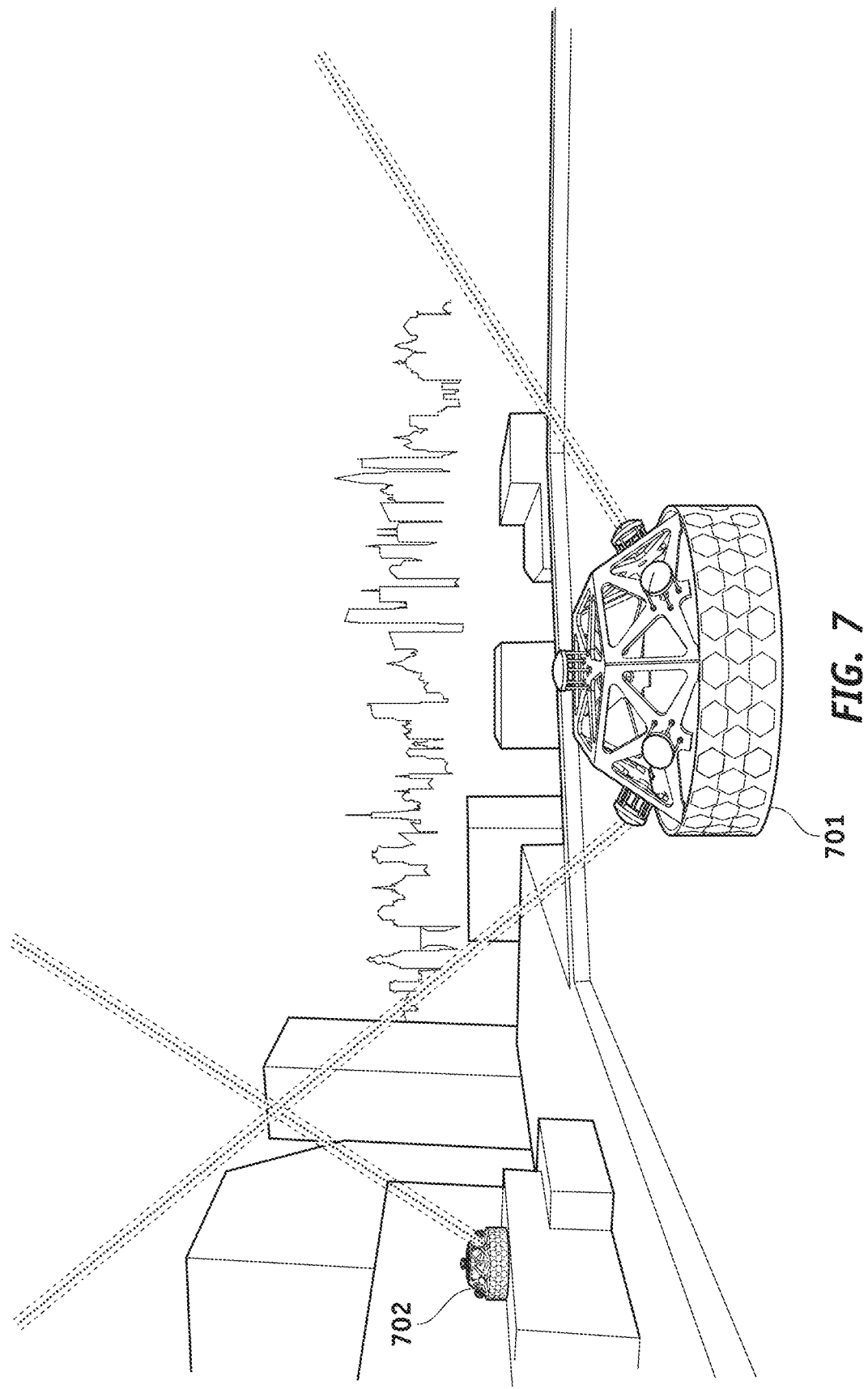

FIG. 7 illustrates an exemplary satellite communication application of OGTs. As shown, a system (700) including OGTs (701, 702) may be deployed on rooftops and communicate with satellites (now shown) at fast speeds.

The disclosed methods and devices address the last mile connectivity by providing high data rate wireless non-line of sight (NLOS) communications as well. NLOS connectivity is achieved by strategically placing OGT receivers on suitable locations so we can either perform relay operations or use scattering (reflection) from obstructing objects to close the link.

Figure 8:
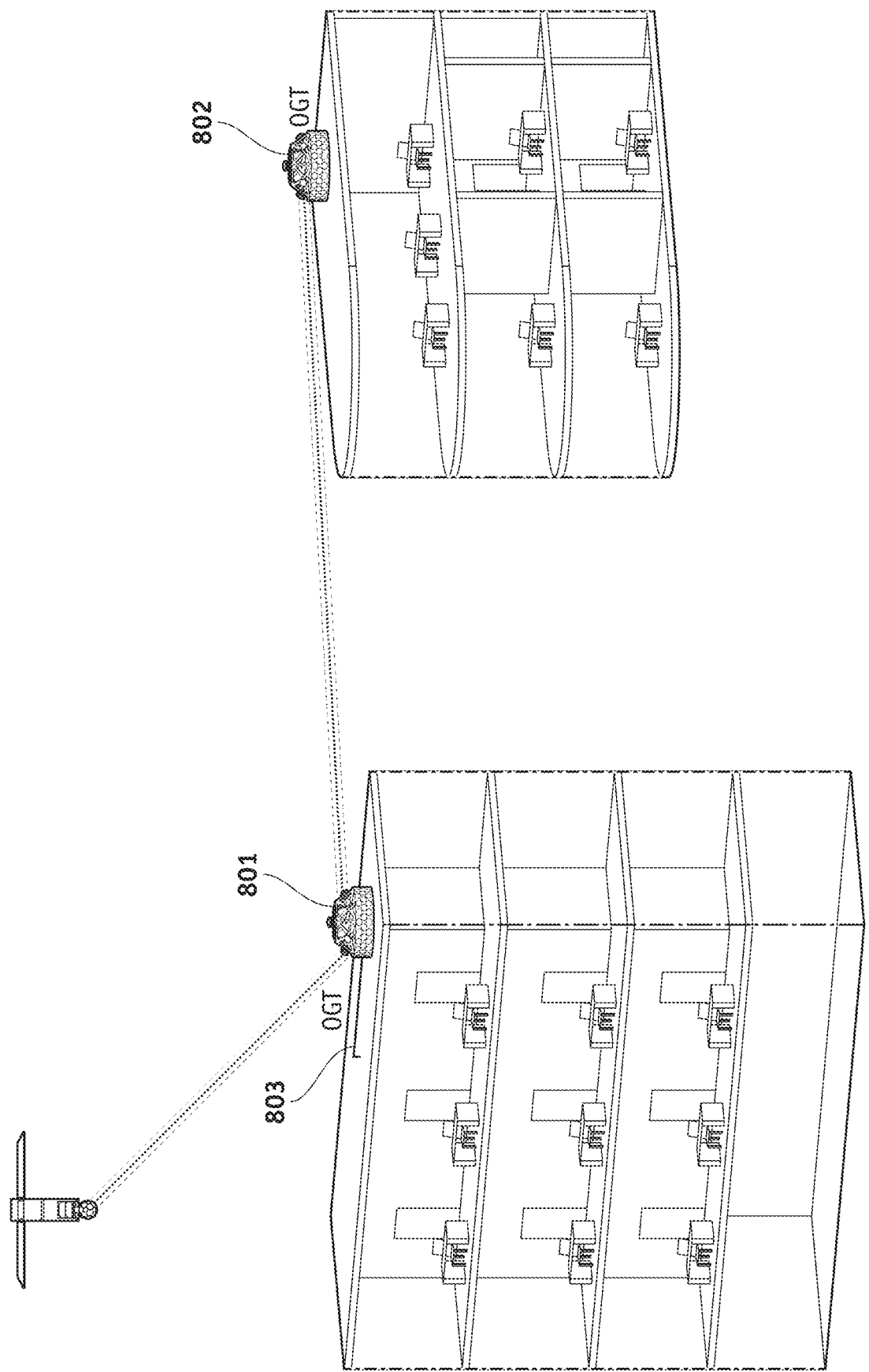
Figure 9:
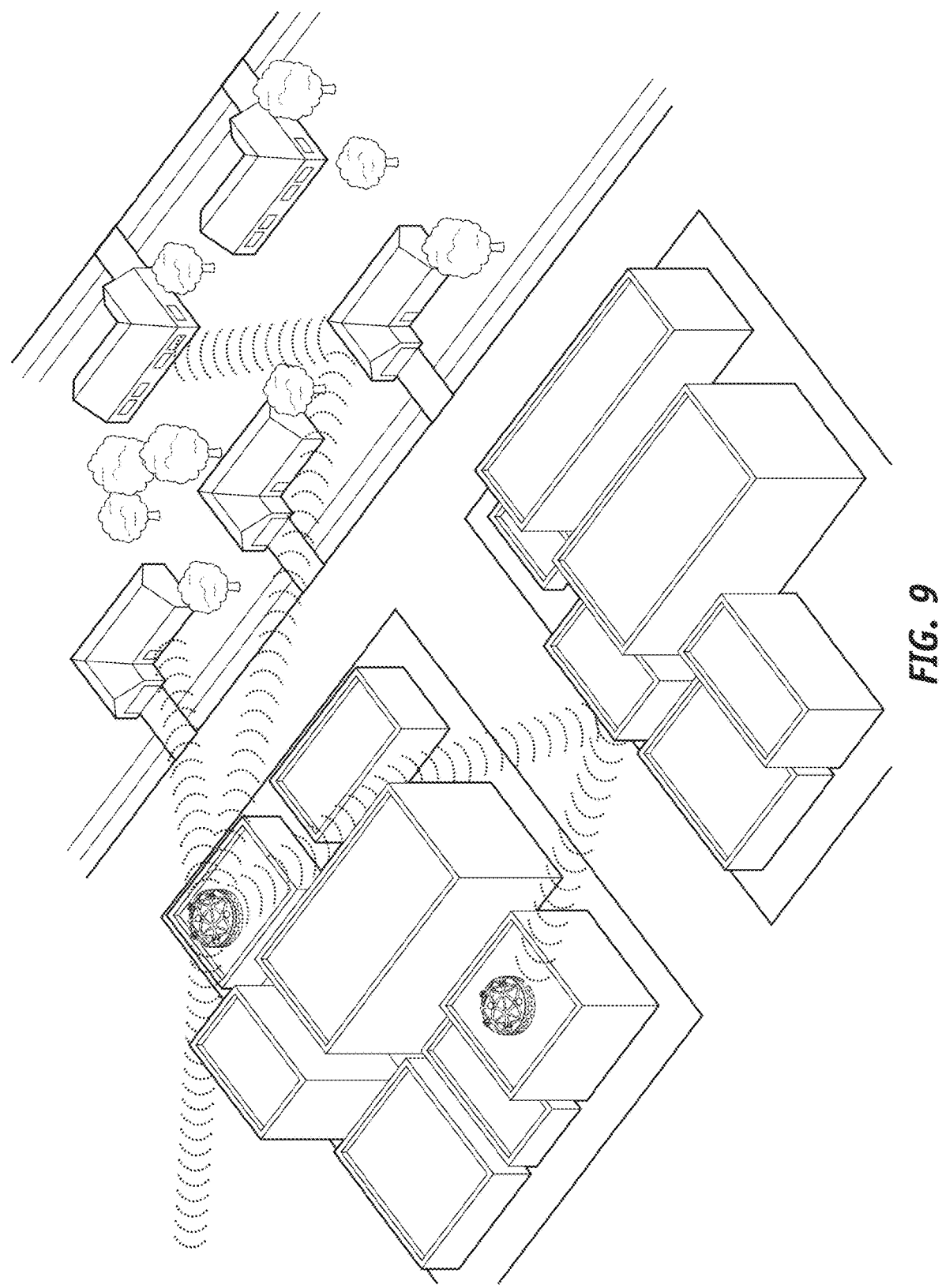

FIG. 8 shows an exemplary last mile implementation of the OGT where two buildings are interconnected via suitable OGTs. In such implementation, OGTs (801, 802) are connected to their respective building's LANs via fiber (803). FIG. 9 shows another exemplary NLOS OGT arrangement.

Figure 10:
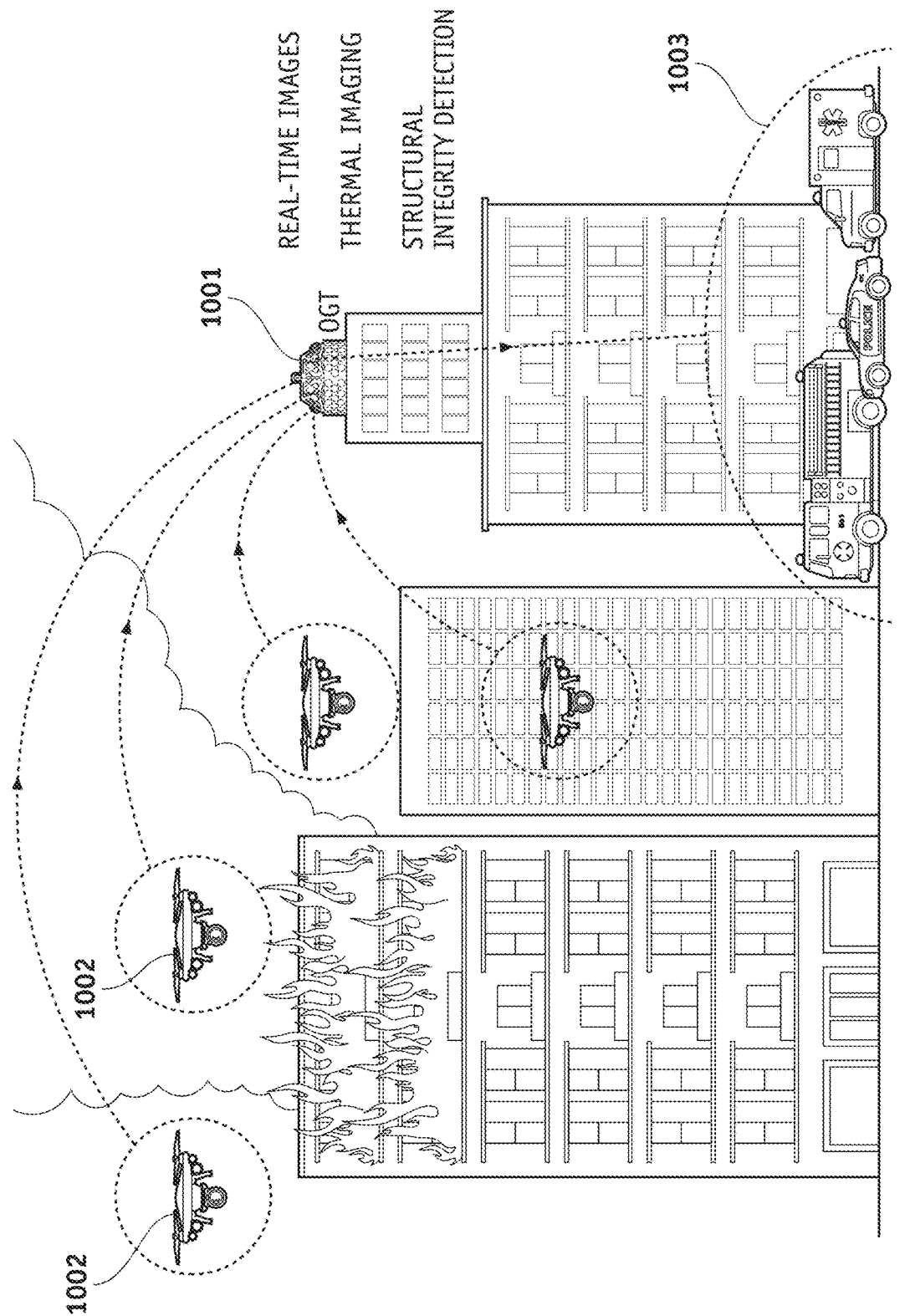

The OGT as disclosed, could be used in emergency responder applications. An example is shown in FIG. 10, where a mobile OGT (1001) could be used as a gateway for a swarm of drones (1002). Drones (1002) could obtain real-time high-resolution optical and thermal images of the zone under distress and share that information with the ground, e.g. responders (1003) via OGT (1001) using either RF or optical links. The drones could also be furnished with radar and/or Lidar payloads for determining structure integrity of the distressed building/area.

Figure 11:
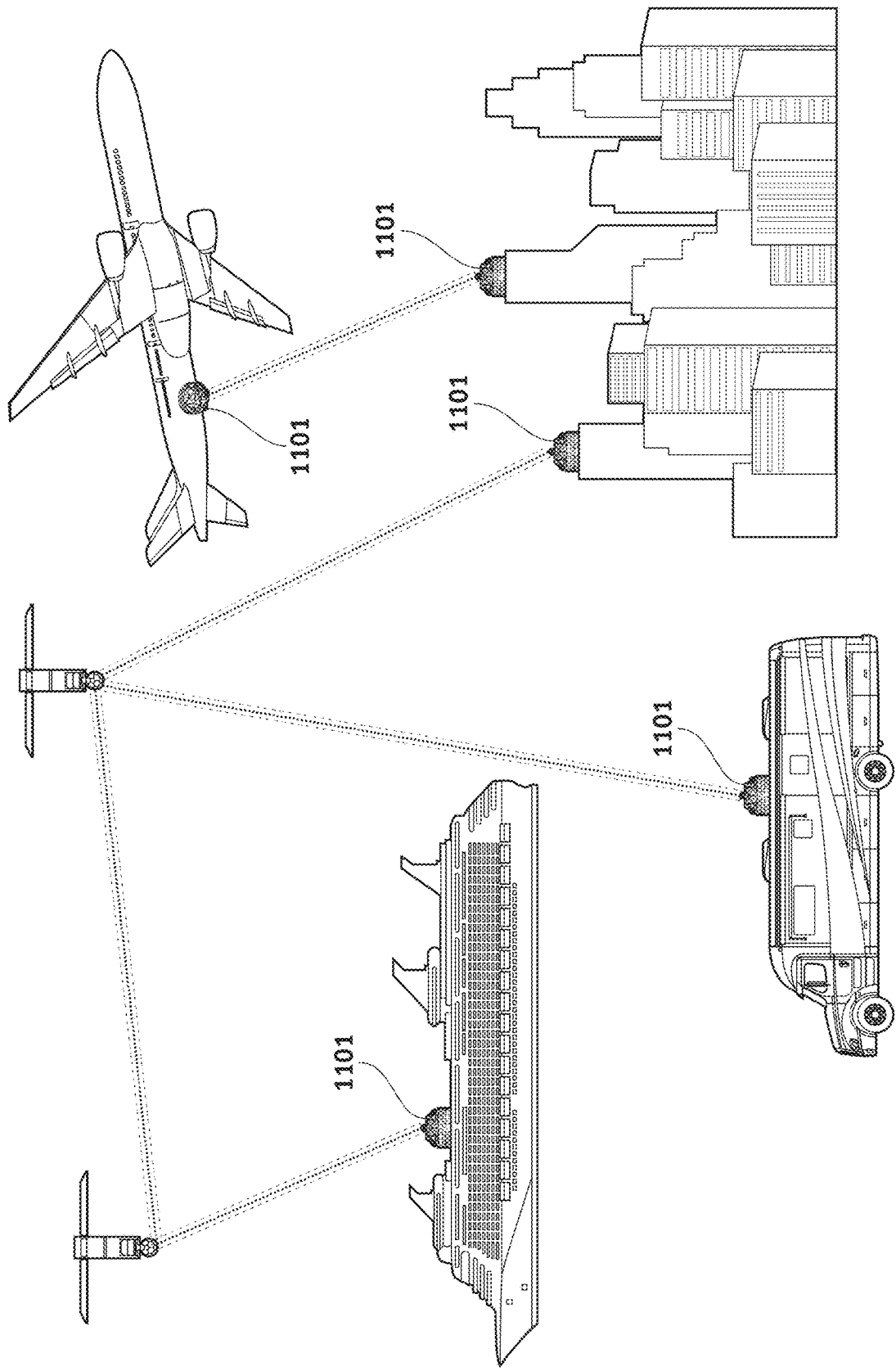

Another exemplary commercial application of the OGT is in mobile communications. Mobile communications include recreation vehicles (RVs), cruise ships, airplanes, etc. FIG. 11 shows high data rate mobile connectivity enabled by OGTs (1101) installed on RV, cruise ships or airplanes and communicating with one another and/or a satellite.

The invention claimed is:

1. An optical ground terminal (OGT) comprising:
   a multifaceted structure with a geometry to allow a full sky coverage, the multifaceted structure having at least one facet comprising a steerable optical telescope, and an array of optical detectors; and
   a mixed signal board including a field-programmable gate array (FPGA) to control the optical telescope and the array of optical detectors, the FPGA being configured to calculate an angle-of-arrival based on a contribution of sensed values, along three different dimensions, of each optical detector of the array of optical detectors via an amplitude and/or phase comparison.

2. The OGT of claim 1, configured to operate at gigabit date rates.

3. The OGT of claim 1, further comprising a small form-factor pluggable (SFP) or RJ45 Ethernet module configured to connect the OGT to a local area network.

4. The OGT of claim 1, wherein the multifaceted structure has a shape of one of a a) dodecahedron, b) half-dodecahedron, c) truncated dodecahedron or d) icosahedron.

5. The OGT of claim 1, wherein the multifaceted structure has a shape of Platonic, Archimedean, or Johnson solids or a combination thereof.

6. The OGT of claim 1, wherein the optical telescope comprises:
   a laser diode with adjustable wavelength;
   a collimator, an optical beam expander and a steerable mirror;
   wherein the optical telescope is configured to:
      generate a laser diode beam by the laser diode;
      collimate the laser diode beam by the collimator to generate a collimated beam;
      expand the collimated beam by the beam expander to generate an expanded beam; and
      impinge the expanded beam on the steering mirror, thereby directing the expanded beam in a direction of a designated target.

7. The OGT of claim 6, further comprising a laser diode controller to control the laser diode based on received information from the FPGA.

8. The OGT of claim 1, wherein the mixed signal board further comprises:
   a transimpedance amplifier (TIA) coupled to the array of optical detectors;
   an analog to digital converter (ADC) coupling the TIA to the FPGA, and
   a limiting amplifier coupling the TIA to the FPGA.

9. The OGT of claim 8, wherein a digitized output of the ADC is used for angle-of-arrival calculations.

10. The OGT of claim 1, wherein the facet further comprises a phase array antenna configured to transmit and receive radio frequency (RF) signals.

11. The OGT of claim 10 further comprising a transmit-receive (TR) module coupling the FPGA to the phase array antenna.

12. The OGT of claim 11, wherein the TR module comprises an RF oscillator, a mixer, an amplifier and a circulator, the TR module being configured to operate in a transmit or receive mode by adjusting the circulator accordingly.

13. The OGT of claim 1, wherein the array of optical detectors comprises photodectors, avalanche photodetectors and/or silicon photomultipliers.

14. The OGT of claim 6, further comprising micro electro-mechanical systems (MEMS), voice-coil, optical phase arrays or galvanometer used to steer the steerable mirror.

15. A communication system comprising a plurality of OGTs of claim 2 deployed on rooftops, recreation vehicles (RVs), cruise ships, or airplanes.

16. The communication system of claim 15, further comprising one or more satellites communicating with the plurality of OGTs.

17. A last-mile arrangement of a plurality of the OGTs of claim 1, connecting a plurality of buildings to one another via the plurality of OGTs, and wherein each OGT is connected to a respective building via a fiber.

18. A communication system comprising a plurality of OGTs of claim 2 deployed on rooftops, the plurality of OGTs configured to communicate with a swarm of drones.

19. The OGT of claim 10, wherein the phase array antenna is electronically steerable.

20. The OGT of claim 1, wherein the contribution of the sensed values includes the sum of sensed amplitudes along each of the three different dimensions.

21. The OGT of claim 1, wherein the outputs of all detectors from each facet are summed to produce a single summed output; and wherein the summed outputs of the facets are used to generate 3-dimensional angle-of-arrival information comprising azimuth and elevation.

22. A method of data communication at gigabit rates, the method comprising:
providing a multifaceted structure with a geometry to allow a full sky coverage;
placing a steerable optical telescope and an array of optical detectors on each facet of the multifaceted structure;
receiving an incoming signal through the array of optical detectors;
calculating an angle-of-arrival based on sensed values from contributing optical detectors of the arrays of optical detectors, along three different dimensions via an amplitude and/or phase comparison;
selecting an optical telescope based on the calculated angle-of-arrival; and
steering the optical telescope to transmit in a direction of a designated target.

23. A method of data communication at gigabit rates, the method comprising:
providing a multifaceted structure with a geometry to allow a full sky coverage;
placing a steerable optical telescope, a phase array antenna, and an array of optical detectors on each facet of the multifaceted structure;
A) in a first mode:
receiving an optical signal by the array of optical detectors;
transforming the optical signal to an electrical signal;
amplifying the electrical signal to generate an amplified signal; and
transmitting the amplified signal through the phased array antenna in a direction of a designated target,
B) in a second mode:
receiving a radio frequency (RF) signal via the phase array antenna;
demodulating the RF signal to generate a baseband signal;
passing the baseband signal to the optical telescope; and
optically transmitting in a direction of a designated target.

24. The method of claim 23, further comprising:
in a third mode:
receiving a radio frequency (RF) signal via the phase array antenna;
calculating an angle of arrival based on sensed values from contributing phased array antennas;
selecting a phased array antenna based on the calculated angle-of-arrival, and
steering the selected phased array antenna to transmit in a direction of a designated target.

* * * * *